US011625330B2

(12) United States Patent
Ma et al.

(10) Patent No.: US 11,625,330 B2
(45) Date of Patent: *Apr. 11, 2023

(54) STORAGE DEVICE USING BUFFER MEMORY IN READ RECLAIM OPERATION

(71) Applicant: SAMSUNG ELECTRONICS CO., LTD., Suwon-si (KR)

(72) Inventors: Jin-Hee Ma, Seoul (KR); Sukhee Lee, Hwaseong-si (KR); Jisoo Kim, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/688,148

(22) Filed: Mar. 7, 2022

(65) Prior Publication Data
US 2022/0188236 A1 Jun. 16, 2022

Related U.S. Application Data

(63) Continuation of application No. 16/506,809, filed on Jul. 9, 2019, now Pat. No. 11,301,388.

(30) Foreign Application Priority Data

Oct. 5, 2018 (KR) .......................... 10-2018-0119087

(51) Int. Cl.
*G06F 12/0868* (2016.01)
*G06F 11/10* (2006.01)
*G11C 29/52* (2006.01)

(52) U.S. Cl.
CPC ...... *G06F 12/0868* (2013.01); *G06F 11/1068* (2013.01); *G11C 29/52* (2013.01); *G06F 2212/1032* (2013.01); *G06F 2212/608* (2013.01)

(58) Field of Classification Search
None
See application file for complete search history.

(56) References Cited

U.S. PATENT DOCUMENTS 6,396,744 B1   5/2002   Wong
8,886,990 B2   11/2014  Meir et al.
(Continued)

FOREIGN PATENT DOCUMENTS

EP    2565792 A1      3/2013
KR    2014-0025574 A  3/2014
(Continued)

OTHER PUBLICATIONS

Korean Examination Report dated Dec. 21, 2022 From the Korean Patent Office.

*Primary Examiner* — Cynthia Britt
*Assistant Examiner* — Matthew W Wahlin
(74) *Attorney, Agent, or Firm* — Volentine, Whitt & Francos, PLLC

(57) ABSTRACT

A storage device includes a nonvolatile memory device, a memory controller, and a buffer memory. The memory controller determines a first memory block of the nonvolatile memory device, which is targeted for a read reclaim operation, and reads target data from a target area of the first memory block. The target data are stored in the buffer memory. The memory controller reads at least a portion of the target data stored in the buffer memory in response to a read request corresponding to at least a portion of the target area.

20 Claims, 13 Drawing Sheets

(56) References Cited

U.S. PATENT DOCUMENTS

| | | | |
|---|---|---|---|
| 9,229,644 B2 | 1/2016 | Ng et al. | |
| 10,157,024 B2 | 12/2018 | Kim et al. | |
| 11,301,388 B2* | 4/2022 | Ma | G06F 11/1068 |
| 2014/0379960 A1 | 12/2014 | Linkewitsch | |
| 2016/0019111 A1 | 1/2016 | Kochar et al. | |
| 2016/0041869 A1 | 2/2016 | Davis | |
| 2017/0277449 A1 | 9/2017 | Feng et al. | |
| 2018/0018259 A1 | 1/2018 | Chu et al. | |
| 2018/0039573 A1 | 2/2018 | Shung | |
| 2018/0113614 A1 | 4/2018 | Lee et al. | |
| 2018/0181326 A1 | 6/2018 | Kim | |
| 2018/0190362 A1 | 7/2018 | Barndt | |
| 2018/0276136 A1 | 9/2018 | Ji et al. | |

FOREIGN PATENT DOCUMENTS

| | | |
|---|---|---|
| KR | 20160144546 A | 12/2016 |
| KR | 20180076715 A | 7/2018 |
| KR | 20180076765 A | 7/2018 |

* cited by examiner

STORAGE DEVICE USING BUFFER MEMORY IN READ RECLAIM OPERATION

CROSS-REFERENCE TO RELATED APPLICATIONS

This is a Continuation of U.S. application Ser. No. 16/506,809, filed Jul. 9, 2019, which issued as U.S. Pat. No. 11,301,388 on Apr. 12, 2022, and a claim of priority under 35 U.S.C. § 119 is made to Korean Patent Application No. 10-2018-0119087 filed on Oct. 5, 2018, in the Korean Intellectual Property Office, the disclosures of which are incorporated by reference herein in their entireties.

BACKGROUND

Embodiments of the disclosure described herein relate to a semiconductor memory device, and more particularly, relate to a storage device using a buffer memory in a read reclaim operation.

A flash memory device is being widely used as a data storage medium of various electronic devices such as a computer, a smartphone, a personal digital assistant (PDA), or a portable computer. However, an erase operation is performed before an operation of writing data to a flash memory, and the unit of data to be erased may be greater than the unit of data to be written.

An operating mode called "read reclaim" is being used in various storage devices including a flash memory device. When a read operation is repeated on any one memory block, error bits increase due to the read disturbance. The read reclaim refers to an operation to copy data stored in a memory block into any other memory block before an uncorrectable error occurs at the data stored in the memory block.

In the case where the read reclaim operation is delayed, an uncorrectable error may occur at relevant data, and thus, the data may be lost. Also, a response to a read request of a host may be delayed due to the read reclaim operation. Accordingly, there is required the way to prevent the quality of the storage device from deteriorating due to the read reclaim operation.

SUMMARY

Embodiments of the disclosure provide a storage device using a buffer memory in a read reclaim operation so as to prevent a speed of a read operation from decreasing and prevent data from being lost.

According to an exemplary embodiment, a storage device includes a nonvolatile memory device, a memory controller, and a buffer memory. The memory controller determines a first memory block of the nonvolatile memory device, which is targeted for a read reclaim operation, and reads target data from a target area of the first memory block. The target data are stored in the buffer memory. The memory controller copies data stored in the first memory block including the target data to a second memory block of the nonvolatile memory device and reads at least a portion of the target data stored in the buffer memory in response to a read request corresponding to at least a portion of the target area.

According to an exemplary embodiment, a storage device includes a nonvolatile memory and a memory controller. The nonvolatile memory includes a first area and a second area. In response to determining to execute a read-reclaim operation in which the memory controller copies target data, stored in the first area, to the second area and erases the target data from the first area, the memory controller: (1) copies the target data stored in the first area to another memory location, and (2) prior to erasing the target data from the first area through the read-reclaim operation, communicates specified data, among the target data, from the other memory location to a host device, which is external to the storage device, in response to a request for the specified data that is received from the host device.

For example, the target area may be detected based on a result of comparing a read count and a reference read count. For example the target area may be detected based on an operation of correcting an error bit.

BRIEF DESCRIPTION OF THE FIGURES

The above and other objects and features of the disclosure will become apparent by describing in detail exemplary embodiments thereof with reference to the accompanying drawings.

DETAILED DESCRIPTION

Below, embodiments of the disclosure will be described clearly and in detail with reference to accompanying drawings to such an extent that one of ordinary skill in the art may implement embodiments of the disclosure.

Figure 1:
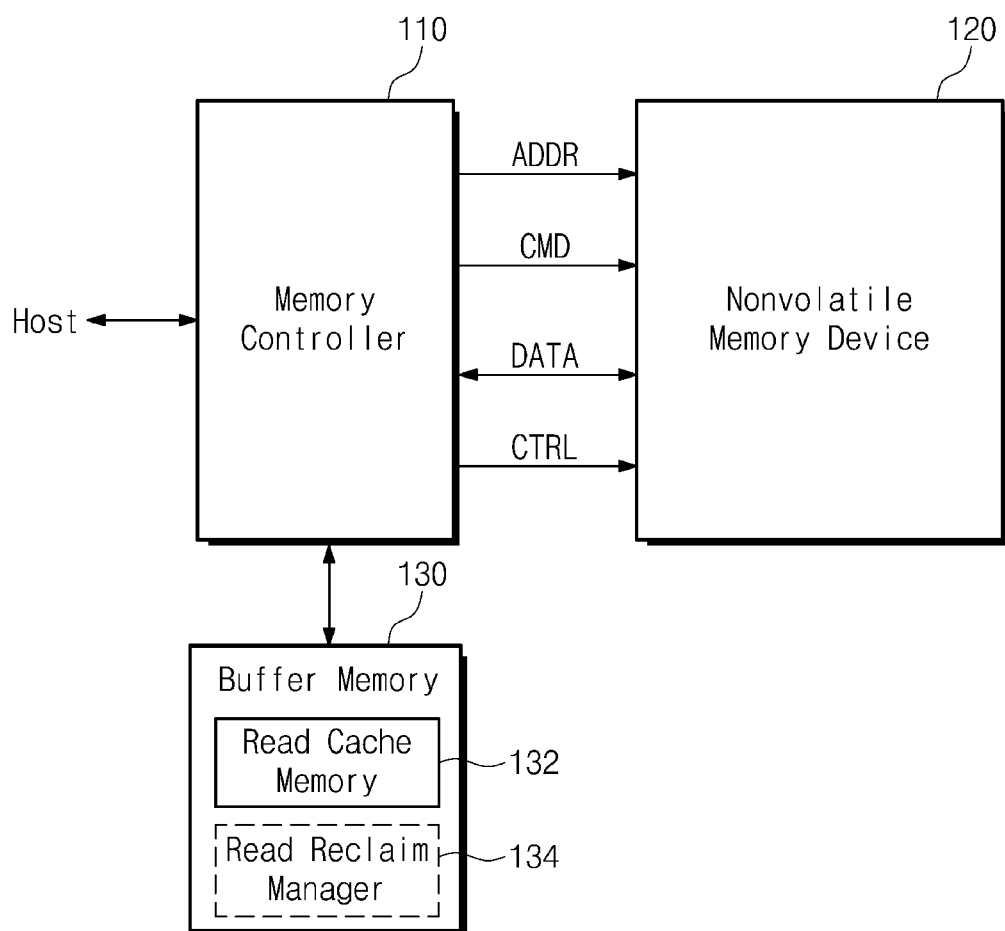
FIG. 1 is a block diagram illustrating a storage device according to an embodiment of the disclosure.

FIG. 1 is a block diagram illustrating a storage device according to an embodiment of the disclosure. Referring to FIG. 1, a storage device 100 includes a memory controller 110, a nonvolatile memory device 120, and a buffer memory 130. For example, the storage device 100 may be implemented in the form of, but is not limited to, a solid state drive (SSD), a memory card, an embedded multimedia card (eMMC), or a universal flash storage (UFS).

The memory controller 110 may control the nonvolatile memory device 120 under control of an external device such as a host. For example, in response to an external request, the memory controller 110 may write data "DATA" to the nonvolatile memory device 120 or may read the data "DATA" stored in the nonvolatile memory device 120. To this end, the memory controller 110 may transmit an address ADDR, a command CMD, and a control signal CTRL to the nonvolatile memory device 120.

The memory controller 110 may manage the storage device 100 by using the buffer memory 130. For example, the memory controller 110 may temporarily store data to be written to the nonvolatile memory device 120 or data read from the nonvolatile memory device 120 in the buffer memory 130. For example, the memory controller 110 may load metadata necessary to manage the nonvolatile memory device 120 into the buffer memory 130.

The nonvolatile memory device 120 may operate under control of the memory controller 110. For example, the nonvolatile memory device 120 may receive the address ADDR, the command CMD, and the control signal CTRL. The nonvolatile memory device 120 may store the data "DATA" in a space corresponding to the address ADDR or may transmit the data "DATA" corresponding to the address ADDR to the memory controller 110.

The buffer memory 130 may store codes or instructions which the memory controller 110 executes. The buffer memory 130 may store data processed by the memory controller 110. Software (or firmware) for controlling the memory controller 110 may be loaded into the buffer memory 130. The buffer memory 130 may be a random access memory (RAM), for example, a dynamic RAM (DRAM). Although not illustrated in drawings, a flash translation layer FTL or various memory management modules may be stored in the buffer memory 130. For example, the flash translation layer FTL may perform address mapping performed for an interface between the nonvolatile memory device 120 and the host, garbage collection, wear leveling, etc.

The buffer memory 130 may include a read cache memory 132. The read cache memory 132 may be defined as a memory area which is used to store data to be moved to any other memory block within the nonvolatile memory device 120 in the read reclaim operation. As described above, the read reclaim refers to an operation to copy data stored in a memory block into any other memory block before an uncorrectable error occurs at the data stored in the memory block.

The read cache memory 132 may store data, which have the high probability that an uncorrectable error occurs, from among data stored in the nonvolatile memory device 120. Alternatively, the read cache memory 132 may store data, which correspond to a page having the high probability of causing an uncorrectable error of any other page, from among data stored in the nonvolatile memory device 120. A page having the high probability that an uncorrectable error may occur or a page having the high probability of causing an uncorrectable error of any other page may be defined as a target area. The way to determine the target area will be described later.

In response to a read request received from the host while the read reclaim operation is performed, data stored in the read cache memory 132 may be transmitted to the host through the memory controller 110. In this case, the read request may correspond to a read request for at least a portion of the target area. The storage device 100 may not read data corresponding to the target area from the nonvolatile memory device 120, but the storage device 100 may read the data stored in the read cache memory 132.

The read cache memory 132 may reduce the loss of data corresponding to the target area or corresponding to a page adjacent to the target area. In the case where the target area is frequently accessed due to an iterative read request for the target area, an uncorrectable error may occur. In this case, relevant data are lost. Instead of the nonvolatile memory device 120, the read cache memory 132 transmits data in response to a read request corresponding to the target area. Accordingly, an access to the target area of the nonvolatile memory device 120 may be prevented.

The read cache memory 132 may reduce a delay of a read operation due to the read reclaim operation. To prevent an uncorrectable error from occurring in the target area or an area adjacent to the target area, in the read reclaim operation, the read operation for the target area of the nonvolatile memory device 120 may be blocked. In particular, in the case where a lot of target areas exist, a time when the read operation is blocked may increase, and a low-priority target area may fail to be registered for the read reclaim operation, thus losing data due to the read operation performed on the low-priority target area. In the case where the read cache memory 132 is not used, for the purpose of reading data stored in the target area, the read operation may be delayed until the read reclaim operation is completed. In the case where the read cache memory 132 is used, in the read reclaim operation, it is possible to read data corresponding to the target area.

A read reclaim manager 134 may be loaded into the buffer memory 130 and may be executed by the memory controller 110. Alternatively, the read reclaim manager 134 may be implemented with hardware such as an application specific integrated circuit (ASIC) or a field programmable gate array (FPGA). As the read reclaim manager 134 is executed by the memory controller 110, the memory controller 110 may detect a target area from the nonvolatile memory device 120 and may write target data corresponding to the target area to the read cache memory 132. As the read reclaim manager 134 is executed, in response to a host request for reading the target area, the memory controller 110 may access the read cache memory 132 to read target data. For example, the read reclaim manager 134 may be implemented with a portion of a code which is driven by the flash translation layer FLT.

Figure 2:
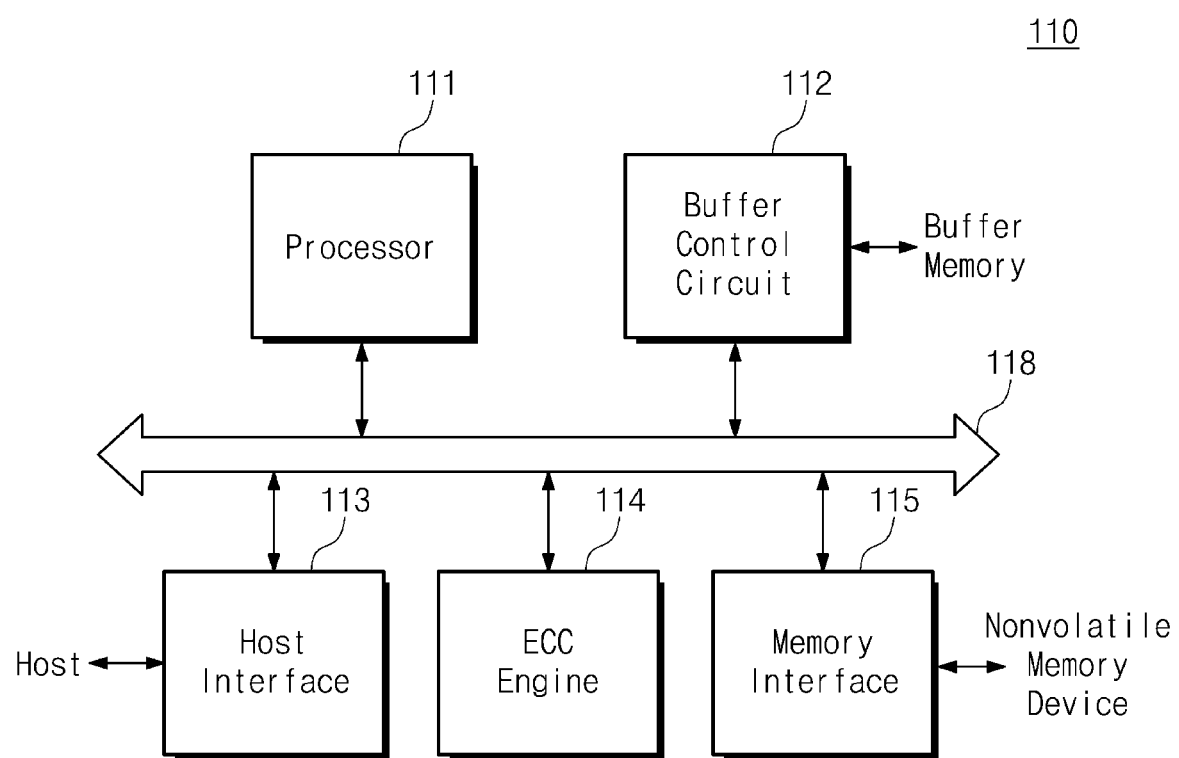
FIG. 2 is a block diagram illustrating a memory controller of FIG. 1.

FIG. 2 is a block diagram illustrating a memory controller of FIG. 1. Referring to FIG. 2, the memory controller 110 includes a processor 111, a buffer control circuit 112, a host interface 113, an error correction code engine 114, and a memory interface 115. For convenience of description, FIG. 2 will be described with reference to reference numerals/marks of FIG. 1.

The processor 111 may control overall operations of the memory controller 110 and may perform a logical operation. The processor 111 may communicate with an external host through the host interface 113, may communicate with the nonvolatile memory device 120 through the memory interface 115, and may communicate with the buffer memory 130 through the buffer control circuit 112. The processor 111 may control the storage device 100 by using the buffer memory 130.

The processor 111 may execute the read reclaim manager 134 loaded into the buffer memory 130. As the read reclaim manager 134 is executed, the processor 111 may detect a target area for the read reclaim operation and may store target data corresponding to the target area to the read cache memory 132. In response to a read request of the host, the processor 111 may read the target data stored in the read cache memory 132.

The buffer control circuit 112 is configured to control the buffer memory 130 under control of the processor 111. For example, the buffer control circuit 112 may allow the buffer memory 130 to temporarily store data "DATA" which the nonvolatile memory device 120 and the host exchange. The buffer control circuit 112 may allow the buffer memory 130 to store target data in the read reclaim operation and may allow the buffer memory 130 to output the target data in response to a read request for the target area.

The host interface 113 is configured to communicate with the host under control of the processor 111. The host interface 113 may be configured to make communication by using at least one of various communication manners, such as a universal serial bus (USB), a serial AT attachment (SATA), a small computer system interface (SCSI), a serial attached SCSI (SAS), a high speed interchip (HSIC), a peripheral component interconnection (PCI), a PCI express (PCIe), a nonvolatile memory express (NVMe), a universal flash storage (UFS), a digital (SD), a multimedia card (MMC), an embedded MMC (eMMC), a dual in-line memory module (DIMM), a registered DIMM (RDIMM), and a load reduced DIMM (LRDIMM).

The error correction code engine 114 may correct an error of data due to various causes. For example, the error correction code engine 114 may perform an operation of detecting and correcting an error of data read from the nonvolatile memory device 120. For example, in response to a request of the read reclaim manager 134, the error correction code engine 114 may count the number of correctable cells of a page storing the read data or the number of times that an operation for correction is performed. A target area of the nonvolatile memory device 120 may be detected based on a result of counting the number of correctable cells or a result of counting the number of times. However, the disclosure is not limited thereto. For example, the target area may be detected without using the error correction code engine 114. For example, the target area may be determined by detecting a read count, in response to a request of the read reclaim manager 134. How to detect a target area will be described later.

The memory interface 115 is configured to communicate with the nonvolatile memory device 120 under control of the processor 111. The memory interface 115 may convey the command CMD, the address ADDR, and the data "DATA" to the nonvolatile memory device 120 through an input/output channel. The memory interface 115 may convey a control signal to the nonvolatile memory device 120 through a control channel.

A bus 118 provides a communication path between the components of the memory controller 110. The processor 111, the buffer control circuit 112, the host interface 113, the error correction code engine 114, and the memory interface 115 may exchange data with each other through the bus 118. The bus 118 may be configured to support various types of communication formats which are used in the memory controller 110.

Figure 3:
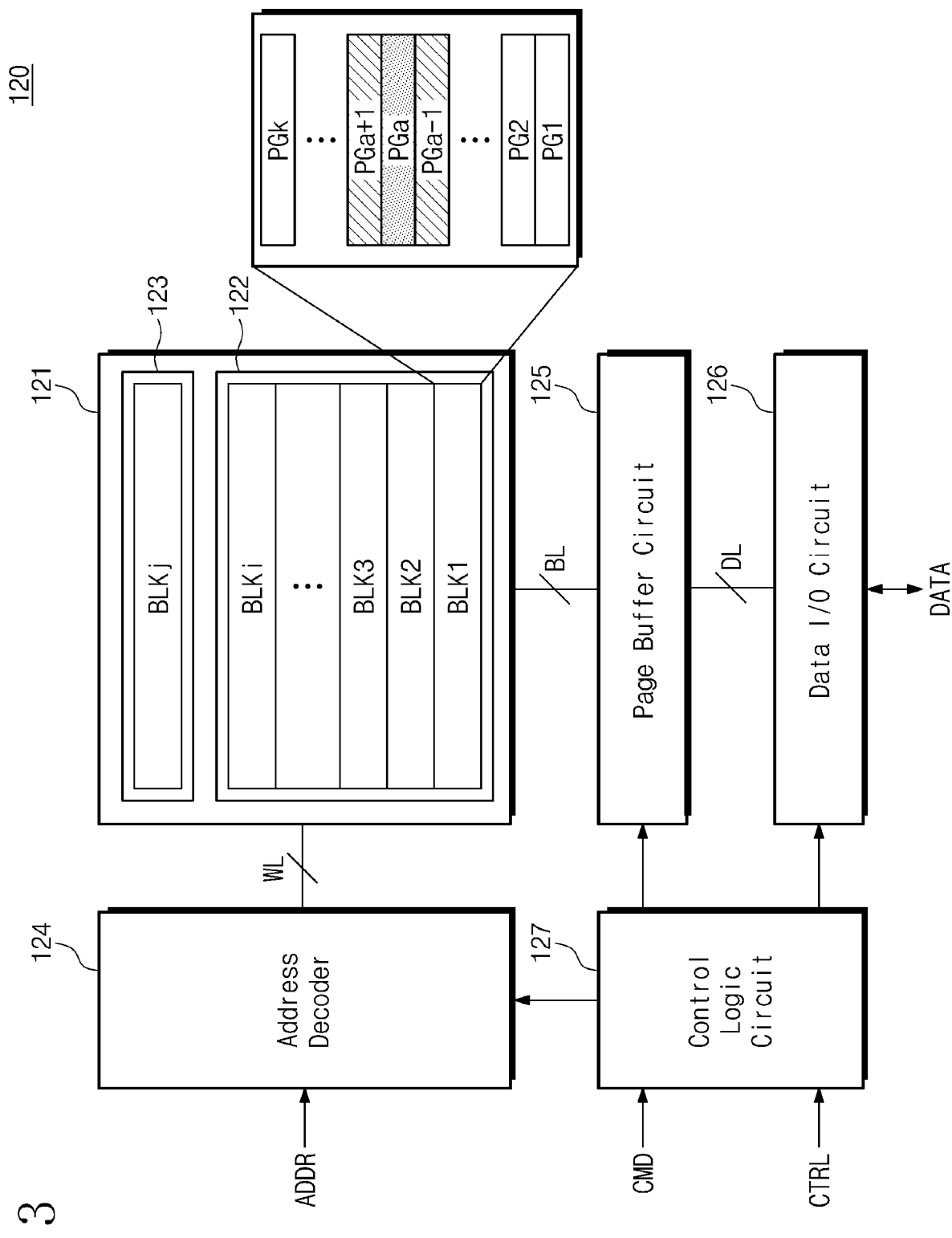
FIG. 3 is a block diagram illustrating a nonvolatile memory device of FIG. 1.

FIG. 3 is a block diagram illustrating a nonvolatile memory device of FIG. 1. Referring to FIG. 3, the nonvolatile memory device 120 includes a memory cell array 121, an address decoder 124, a page buffer circuit 125, a data input/output circuit 126, and a control logic circuit 127. For convenience of description, FIG. 3 will be described with reference to reference numerals/marks of FIG. 1.

The memory cell array 121 may include a first memory area 122 and a second memory area 123. The first memory area 122 includes first to i-th memory blocks BLK1 to BLKi. The second memory area 123 is illustrated as including one memory block BLKj, but the disclosure is not limited thereto. For example, each of the plurality of memory blocks BLK1 to BLKj includes a plurality of pages. For example, the first memory block BLK1 may include first to k-th pages PG1 to PGk. In the first memory area 122 and the second memory area 123, a write operation and a read operation may be performed for each page. The erase operation may be performed for each memory block.

The memory cell array 121 is connected to the address decoder 124 through word lines WL or selection lines and is connected to the page buffer circuit 125 through bit lines BL. One page may be connected to one word line. A read voltage may be applied to a page targeted for the read operation, and a non-selection read voltage may be applied to the remaining pages in the same memory block. The non-selection read voltage which is a voltage for turning on transistors in unselected pages may be higher in level than the read voltage. Accordingly, when the non-selection read voltage is applied to unselected pages, the amount of charges injected into memory cells included in the pages may be affected by the interference. This interference may be defined as the read disturbance.

For example, in the case where a read operation is performed on an a-th page PGa, the non-selection read voltage may be applied to first to (a−1)-th pages PG1 to PGa−1 and (a+1)-th to k-th pages PGa+1 to PGk. In particular, in the case where a read operation is repeatedly performed on the a-th page PGa, the (a+1)-th page PGa+1 and the (a−1)-th page PGa−1 adjacent to the a-th page PGa may be repeatedly influenced by the interference due to a potential difference between the read voltage and the non-selection read voltage. That is, the (a+1)-th page PGa+1 and the (a−1)-th page PGa−1 may be influenced by greater read disturbance than the remaining pages.

A page, which has the high probability that an uncorrectable error occurs, from among the first to k-th pages PG1 to PGk may be determined as a target area by the memory controller 110. To determine a target area, the memory controller 110 may calculate the probability that an uncorrectable error of a page occurs. In the case where the probability that an uncorrectable error of a checked page occurs is not smaller than (or exceeds) a reference value, the memory controller 110 may determine the checked page as a target area.

For example, a target area may be detected during a background operation where a read request of a host is not provided. During the background operation, the memory controller 110 may periodically perform a read operation on memory blocks for the purpose of detecting an error. For example, the memory controller 110 may perform a read operation on pages randomly or sequentially. The memory controller 110 may check an error of a page where the read operation is performed, for example, through data scrubbing.

For example, the memory controller 110 may determine a target area, based on an error bit of a relevant page corrected by the error correction code engine 114, that is, a correction history of an error bit. For example, the memory controller 110 may determine whether a page is included in a target area, based on a result of comparing the number of correctable cells and a reference value. The reference value may be defined as a value which is smaller than the upper limit of correctable cells expected as a read operation fails. For example, the memory controller 110 may determine whether a page is included in a target area, based on a result of comparing the number of times that an error correction operation is performed on the page, with a reference count. The reference count may be defined as a value which is smaller than the upper limit of the number of times expected as a read operation fails.

A page, which has the high probability that an uncorrectable error causes an uncorrectable error at adjacent pages, from among the first to k-th pages PG1 to PGk may be determined as a target area by the memory controller 110. For example, a page where a read operation is frequently performed may cause the read disturbance at adjacent pages. That is, the memory controller 110 may determine a page where a read operation is frequently performed, as a target area. In the case where a read operation is performed on the a-th page PGa in response to a read request of a host, a read count may be compared with a reference read count. The reference read count may be defined as a value which is smaller than the upper limit of a read count expected as an error occurs due to the influence of a particular page on adjacent pages when a read operation is repeatedly performed on the particular page.

In the case where the read count of the a-th page PGa is not smaller than (or exceeds) the reference read count, the a-th page PGa may be defined as a target area. The pages PGa+1 and PGa−1 adjacent to the a-th page PGa have the high probability that an uncorrectable error occurs. Accordingly, the adjacent pages PGa+1 and PGa−1 may be protected by specifying the a-th page PGa as a target area and performing a read operation of the a-th page on the read cache memory 132 instead of the nonvolatile memory device 120. Alternatively, in the case where the read count of the a-th page PGa is not smaller than (or exceeds) the reference read count, the pages PGa+1 and PGa−1 adjacent to the a-th page PGa may be set to a target area.

The read reclaim operation is performed on a memory block in which a target area is included. In the case where a target area is included in the first memory block BLK1, data stored in the first memory block BLK1 may be copied to any other memory block. For example, the data stored in the first memory block BLK1 may be written to the second memory block BLK2, and an erase operation may be performed on the first memory block BLK1. Also, target data corresponding to the target area may be stored to the read cache memory 132 as described above.

In the case where a free space of the read cache memory 132 is insufficient, the second memory area 123 may store the target data. A memory cell included in the first memory area 122 may be a multi-level cell (MLC), and a memory cell included in the second memory area 123 may be a single level cell (SLC). However, the disclosure is not limited thereto. For example, the first memory area 122 may include a triple level cell (TLC) or a quad level cell (QLC). As the number of bits to be stored per memory cell increases, the number of program states increases. This means that the probability that an uncorrectable error occurs increases. In the case where the second memory area 123 includes a single level cell, the single level cell has one of two program states. Accordingly, data stored in the second memory area 123 may have the relatively lower probability that an uncorrectable error occurs, compared to data stored in the first memory area 122.

The address decoder 124 is configured to decode the address ADDR received from the memory controller 110. The address decoder 124 may control voltages to be applied to the word lines WL based on the decoded address ADDR. For example, the address decoder 124 may provide a read voltage to a page targeted for a read operation, and may provide a non-selection read voltage to the remaining pages.

The page buffer circuit 125 may operate as a write driver or a sense amplifier depending on a mode of operation. In a write operation, the page buffer circuit 125 may supply a bit line voltage corresponding to write data to a bit line of the memory cell array 121. In a read operation, the page buffer circuit 125 may sense data stored in a selected memory cell through a bit line.

In the write operation, the data input/output circuit 126 provides the data "DATA" provided from the memory controller 110 to the page buffer circuit 125 through data lines DL. In the read operation, the data input/output circuit 126 receives the data "DATA" from the page buffer circuit 125 through the data lines DL. The data input/output circuit 126 may output the received data "DATA" to the memory controller 110.

The control logic circuit 127 may control the address decoder 124, the page buffer circuit 125, and the data input/output circuit 126 in response to the command CMD and the control logic CTRL provided from the memory controller 110. The write operation, the read operation, or the erase operation of the nonvolatile memory device 120 may be performed based on the command CMD, under control of the control logic circuit 127.

Figure 4:
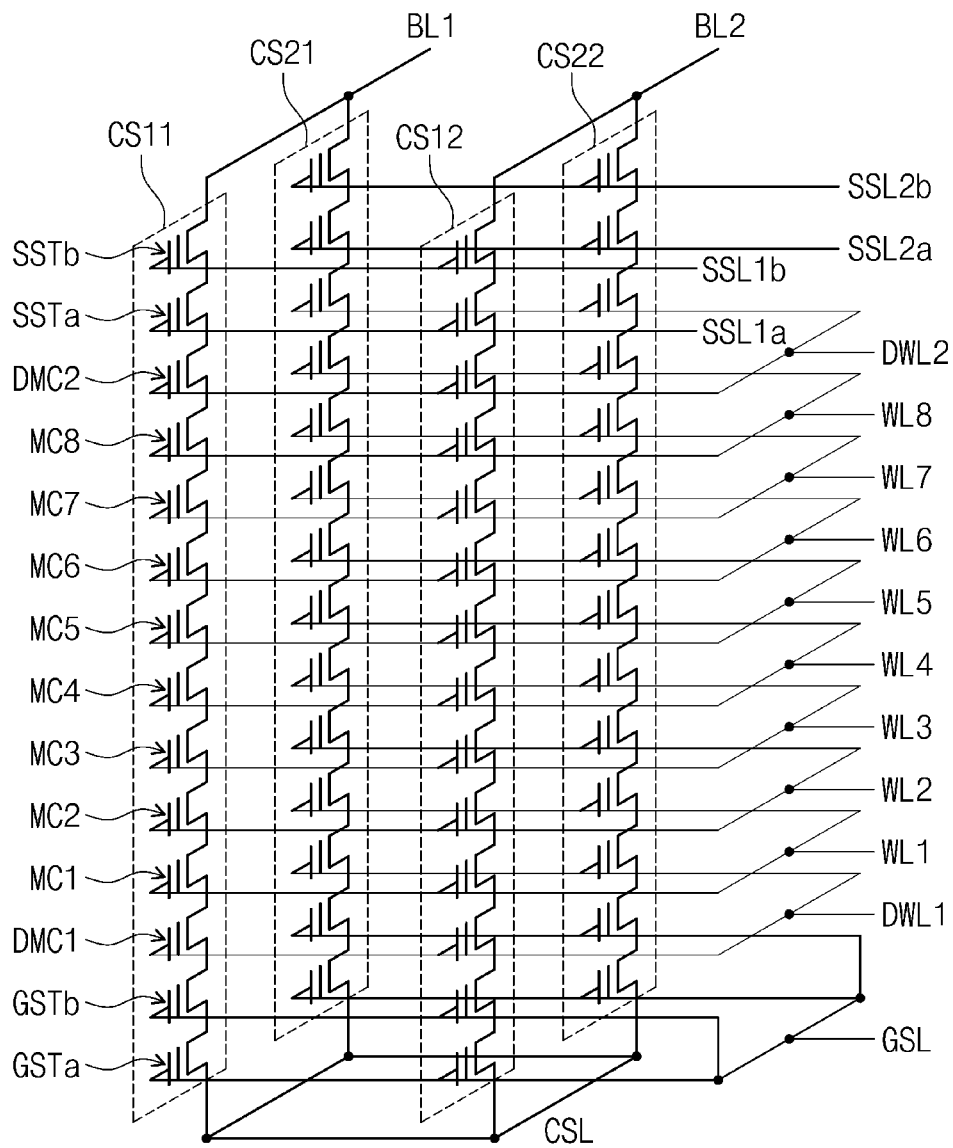
FIG. 4 is a circuit diagram illustrating a memory block of FIG. 3.

FIG. 4 is a circuit diagram illustrating a memory block of FIG. 3. The memory block BLK1 may be any memory block included in the memory cell array 121 of FIG. 3. Referring to FIG. 4, a plurality of cell strings CS11, CS12, CS21, and CS22 may be arranged in a row direction and a column direction.

The cell strings CS11 and CS12 may be connected to string selection lines SSL1a and SSL1b to constitute a first row. The cell strings CS21 and CS22 may be connected to string selection lines SSL2a and SSL2b to constitute a second row. The cell strings CS11 and CS21 may be connected to a first bit line BL1 to constitute a first column. The cell strings CS12 and CS22 may be connected to a second bit line BL2 to constitute a second column.

Each of the cell strings CS11, CS12, CS21, and CS22 may include string selection transistors SSTa and SSTb, a plurality of memory cells MC1 to MC8, ground selection transistors GSTa and GSTb, and dummy memory cells DMC1 and DMC2. For example, each of a plurality of cell transistors included in the cell strings CS11, CS12, CS21, and CS22 may be a charge trap flash (CTF) memory cell.

In each cell string, the memory cells MC1 to MC8 are serially connected and are stacked in a height direction being a direction perpendicular to a plane defined by the row direction and the column direction. Memory cells MC1 to MC8 are controlled by word lines WL1 to WL8, respectively. In each cell string, the string selection transistors SSTa and SSTb are serially connected, and the serially connected string selection transistors SSTa and SSTb are interposed between the memory cells MC1 to MC8 and a relevant bit line BL1 or BL2. In each cell string, the ground selection transistors GSTa and GSTb are serially connected, and the serially connected ground selection transistors GSTa and GSTb are interposed between the memory cells MC1 to MC8 and a common source line CSL. In an embodiment, in each cell string, the first dummy memory cell DMC1 may be provided between the plurality of memory cells MC1 to MC8 and the ground selection transistors GSTa and GSTb. In an embodiment, in each cell string, the second dummy memory cell DMC2 may be provided between the plurality of memory cells MC1 to MC8 and the string selection transistors SSTa and SSTb. Dummy memory cells DMC1 and DMC2 are controlled by dummy word lines DWL1 and DWL2, respectively.

The ground selection transistors GSTa and GSTb of the cell strings CS11, CS12, CS21, and CS22 may be connected in common to a ground selection line GSL. In an embodiment, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to a first ground selection line, and the second ground selection transistors GSTb of the cell strings CS21 and CS22 in the second row may be connected to a second ground selection line.

A read operation and a write operation of the memory block BLK1 may be performed for each row, that is, for each page. For example, one row of the memory block BLK1 may be selected by the string selection lines SSL1a, SSL1b, SSL2a, and SSL2b. As a word line is driven, memory cells having the same height among memory cells in a row are selected. The read operation or the write operation may be performed on the selected memory cells.

An erase operation may be performed on the memory block BLK1. When the erase operation is performed for each memory block, all memory cells MC of the memory block BLK1 may be simultaneously erased depending on an erase request. However, the disclosure is not limited thereto. For example, a part of memory cells MC in the memory block BLK1 may be simultaneously erased depending on an erase request, and the remaining memory cells may be erase-inhibited.

Figure 5:
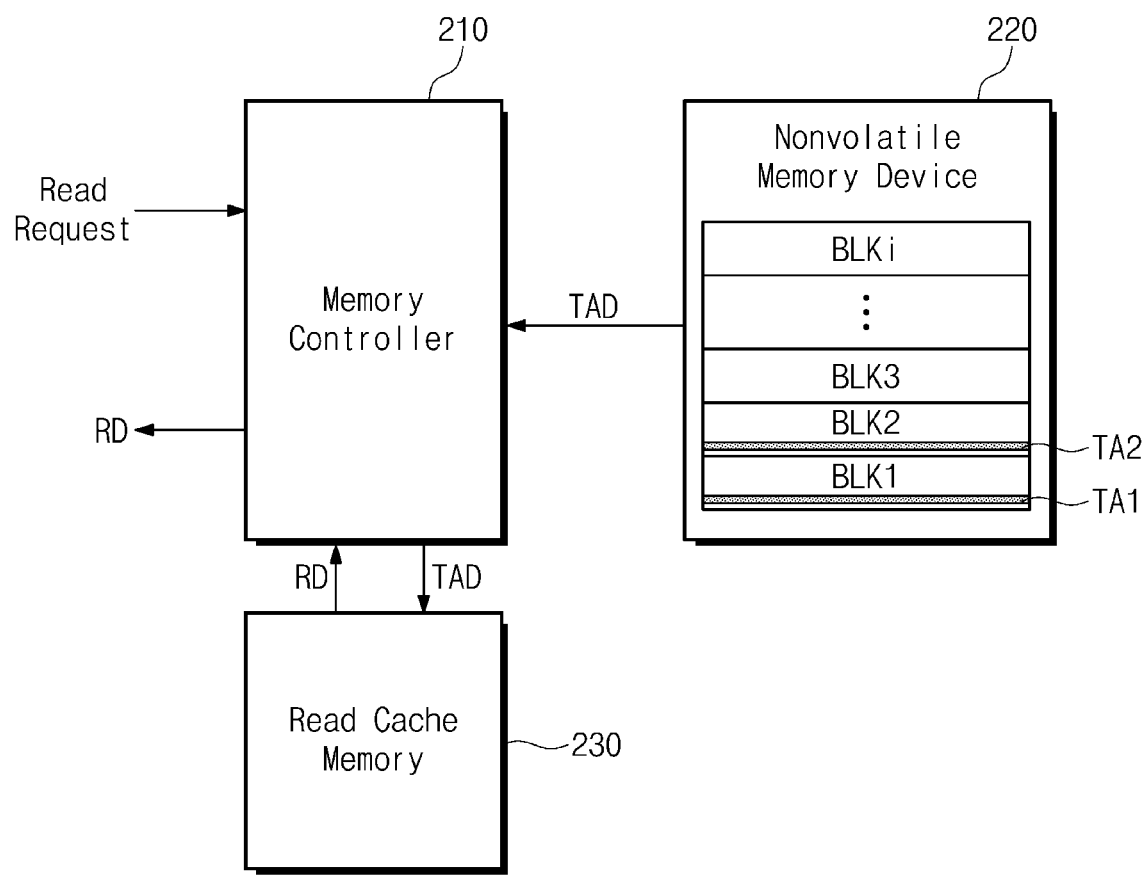
FIG. 5 is a block diagram for describing an operation of a storage device for read reclaim.

FIG. 5 is a block diagram for describing an operation of a storage device for read reclaim. Referring to FIG. 5, a storage device 200 includes a memory controller 210, a nonvolatile memory device 220, and a read cache memory 230. The memory controller 210, the nonvolatile memory device 220, and the read cache memory 230 correspond to the memory controller 110, the nonvolatile memory device 120, and the read cache memory 130 of FIG. 1, respectively.

The nonvolatile memory device 220 includes a plurality of memory blocks BLK1 to BLKi. In an embodiment, the first memory block BLK1 includes a first target area TA1, and a second memory block BLK2 includes a second target area TA2. As described with reference to FIG. 4, the first and second target areas TA1 and TA2 may be detected based on a read count, the number of correctable cells, or the number of times that an error correction operation is performed.

The memory controller 210 may detect the first and second target areas TA1 and TA2 from the nonvolatile memory device 220. The memory controller 210 may determine the first and second target areas TA1 and TA2 in a read operation, or in a read operation for error detection during a background operation. The memory controller 210 may read target data TAD stored in the first and second target areas TA1 and TA2.

The memory controller 210 may write the target data TAD to the read cache memory 230. Afterwards, the memory controller 210 may perform the read reclaim operation on the first and second memory blocks BLK1 and BLK2. For example, data stored in the first and second memory blocks BLK1 and BLK2 may be copied to other memory blocks (e.g., a third memory block BLK3 and an i-th memory block BLKi). The data stored in the first and second memory cells BLK1 and BLK2 may be erased.

The memory controller 210 may receive a read request from a host while performing the read reclaim operation. The read request may refer to a read request for at least one page included in the first and second target areas TA1 and TA2. In this case, the memory controller 210 does not access a relevant page of the nonvolatile memory device 220. The memory controller 210 reads read data RD being data corresponding to the relevant page among the target data TAD stored in the read cache memory 230. The read data RD may be output to the host through the memory controller 210. The host may fail to recognize the read reclaim operation. Accordingly, even during the read reclaim operation, a fast read operation may be possible, and the target data TAD may be prevented from being lost.

Figure 6:
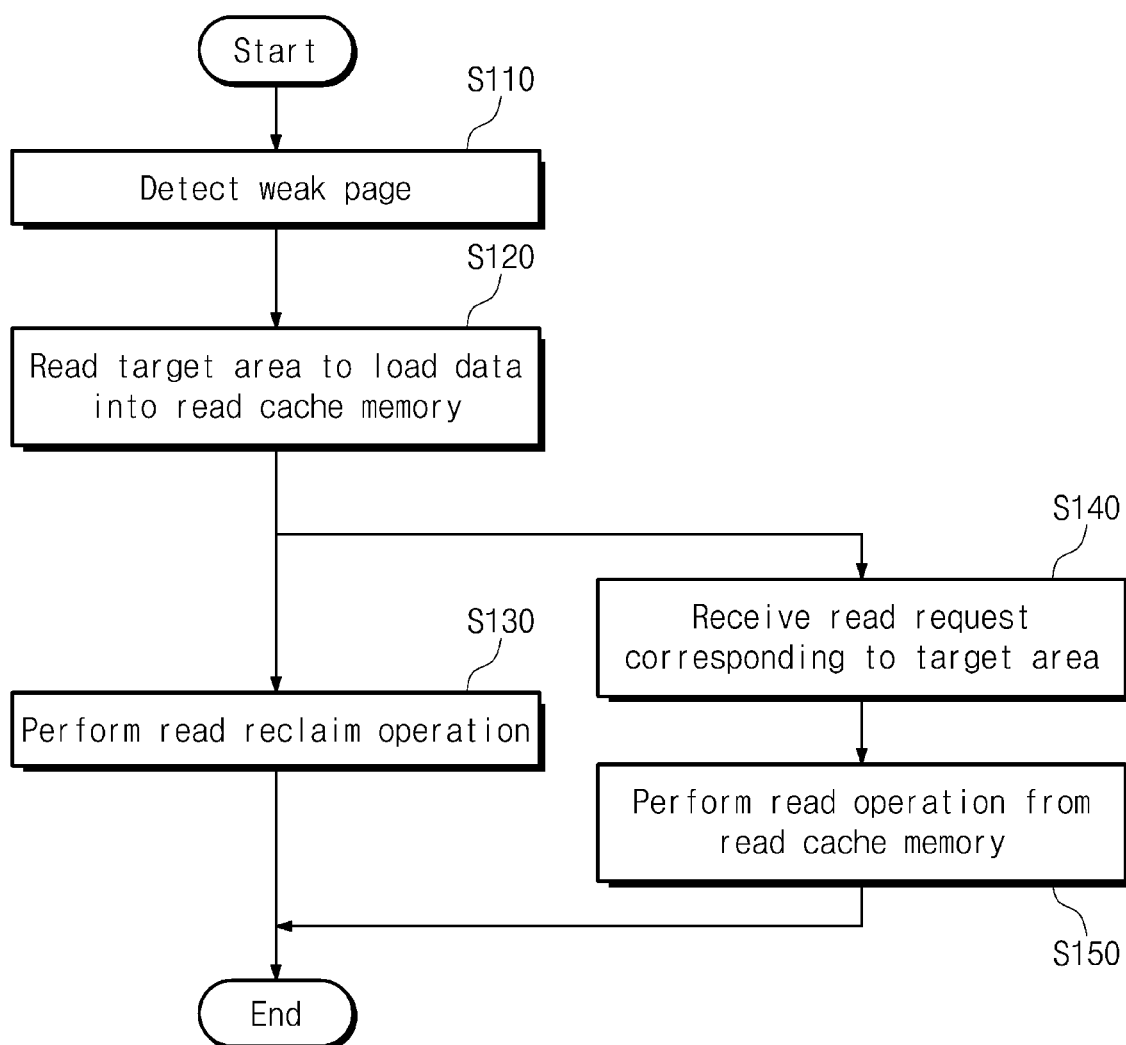
FIG. 6 is a flowchart illustrating a read reclaim method of a storage device of FIG. 5.

FIG. 6 is a flowchart illustrating a read reclaim method of a storage device of FIG. 5. The read reclaim method may be performed by the storage devices 100 and 200 of FIGS. 1 and 5. For convenience of description, FIG. 6 will be described with reference to reference numerals/marks of FIG. 5.

In operation S110, the memory controller 210 detects a weak page. The weak page may be detected in a read operation by the host, or in a read operation for error detection during a background operation.

The weak page may include a page which may cause the loss of data of adjacent pages. For example, the weak page may include a page having a read count (corresponding to a read operation requested by the host) which is not smaller than (or exceeds) the reference read count.

The weak page may include a page which has the high probability that an uncorrectable error occurs. For example, the weak page may include a page in which the number of correctable cells is not smaller than (or exceeds) a reference value in a read operation, or a page in which the number of times that an error correction operation is performed is not smaller than (or exceeds) a reference value. Besides, the weak page may be detected by various ways, for example, the way to analyze threshold voltage distributions of pages.

In operation S120, the memory controller 210 may read the target area and may load the target data TAD corresponding to the target area into the read cache memory 230. The target area may include the weak page.

In operation S130, the memory controller 210 may perform the read reclaim operation on a memory block (a target memory block) including the target area. The memory controller 210 may copy the data stored in the target memory block to any other memory block. The memory controller 210 may read the data from the target memory block, may write the read data to any other memory block, and may erase the target memory block.

In operation S140, the memory controller 210 may receive a read request corresponding to at least one page of the target area. The read request may be received while operation S130 is performed. The read request may be provided from the host.

In operation S150, the memory controller 210 may perform the read operation on the read cache memory 230. The memory controller 210 may access the read cache memory 230 instead of the nonvolatile memory device 220. The memory controller 210 may read the read data RD corresponding to the read-requested page among the target data TAD from the read cache memory 230. The read data RD may be provided to the host through the memory controller 210.

Figure 7:
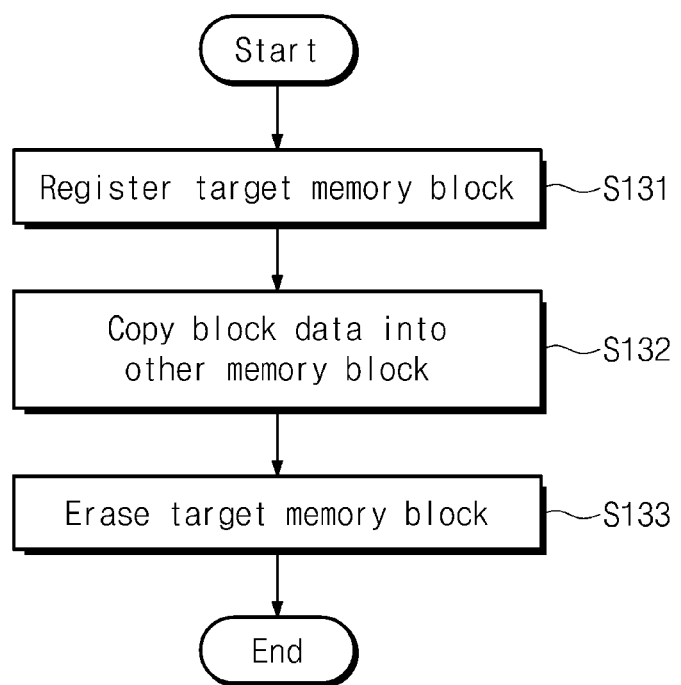
FIG. 7 is a flowchart illustrating operation S130 of FIG. 6 in detail.

FIG. 7 is a flowchart illustrating operation S130 of FIG. 6 in detail. Read reclaim according to operation S130 may be performed by the storage devices 100 and 200 of FIGS. 1 and 5. For convenience of description, FIG. 7 will be described with reference to reference numerals/marks of FIG. 1.

In operation S131, the memory controller 110 may register a target memory block at the read reclaim manager 134. For example, the read reclaim manager 134 may include a queue for performing the read reclaim operation. The memory controller 110 may generate information about the target memory block and may register the generated information at the queue. However, in the case where a registration range of the queue is limited and a memory block targeted for the read reclaim operation is frequently detected, a target memory block may not be registered at the queue until a high-priority read reclaim operation is completed.

In the case where operation S120 does not exist before operation S130, a read operation may be frequently performed on a target area, which is not registered at the queue, depending on a read request of the host, and thus, target data may be lost. However, since the target data are stored to the read cache memory 230 in operation S120, the memory controller 110 may read the target data from the read cache memory 230.

In operation S132, the memory controller 110 may copy block data corresponding to the target memory block to any other memory block. Here, the block data include the target data corresponding to the target area. The memory controller 110 may read the block data from the target memory block and may write the read block data to any other memory block.

In operation S133, the memory controller 110 may erase the target memory block. When a read request for the block data copied in operation S133 is received, the memory controller 210 may read data from the memory block to which the block data are stored in operation S132. The occurrence of an uncorrectable error due to an iterative read operation may be prevented in advance by storing data to any other memory block through the read reclaim operation.

Figure 8:
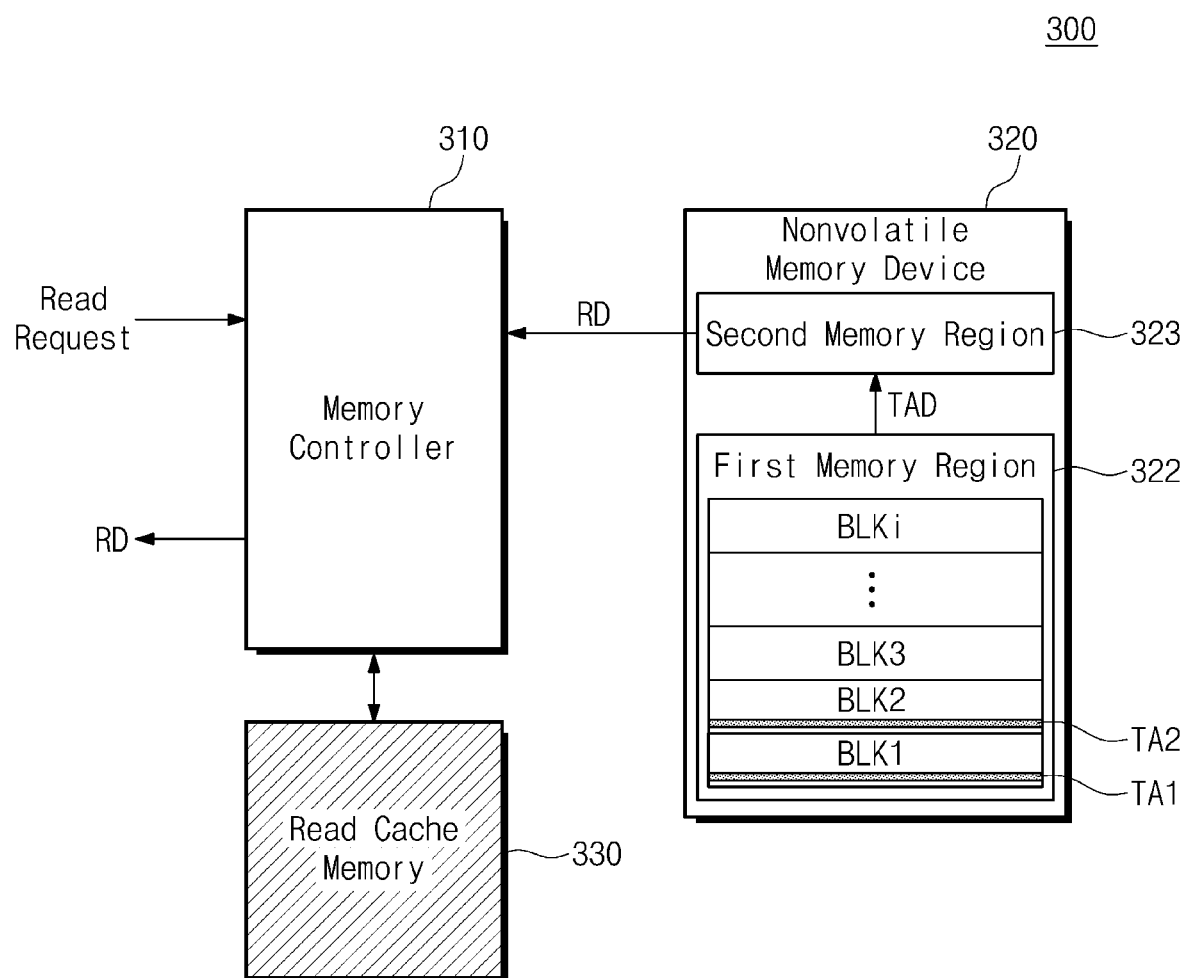
FIG. 8 is a block diagram for describing an operation of a storage device for read reclaim.

FIG. 8 is a block diagram for describing an operation of a storage device for read reclaim. Referring to FIG. 8, a storage device 300 includes a memory controller 310, a nonvolatile memory device 320, and a read cache memory 330. The memory controller 310, the nonvolatile memory device 320, and the read cache memory 330 correspond to the memory controller 110, the nonvolatile memory device 120, and the read cache memory 132 of FIG. 1, respectively.

The nonvolatile memory device 320 may include a first memory area 322 and a second memory area 323. The first memory area 322 and the second memory area 323 correspond to the first memory area 122 and the second memory area 123 of FIG. 3, respectively. The first memory area 322 includes a plurality of memory blocks BLK1 to BLKi. Like FIG. 5, the first memory block BLK1 includes the first target area TA1, and the second memory block BLK2 includes the second target area TA2.

The memory controller 310 may detect the first and second target areas TA1 and TA2 from the nonvolatile memory device 320. The memory controller 310 may read the target data TAD stored in the first and second target areas TA1 and TA2. The memory controller 310 may write the target data TAD to the read cache memory 330. However, a free space of the read cache memory 330 may not be sufficient to store the target data TAD. The memory controller 310 may include a free space of the read cache memory 330.

In the case where a free space of the read cache memory 330 is sufficient to store the target data TAD, like FIG. 5, the target data TAD are stored in the read cache memory 330. However, in the case where a free space of the read cache memory 330 is not sufficient to store the target data TAD, the target data TAD may be stored in the second memory area 323. Afterwards, the memory controller 310 may perform the read reclaim operation on the first and second memory blocks BLK1 and BLK2.

While the read reclaim operation is performed, the memory controller 310 may receive a read request for at least one page included in the first and second target areas TA1 and TA2 from the host. The memory controller 310 may access the second memory area 323 instead of the first memory area 322. The memory controller 310 reads read data RD corresponding to the read request among the target data TAD stored in the second memory area 323. The read data RD may be output to the host through the memory controller 310.

Unlike the illustration of FIG. 8, even though a free space of the read cache memory 330 is insufficient, the target data TAD may be stored to the read cache memory 330. To this end, a portion of data previously stored in the read cache memory 330 may be evicted. For example, the evicted data may be stored in the second memory area 323. A space secured by the evicted data may be used to store the target data TAD. In this case, in response to the read request, the memory controller 310 may read the read data RD from the read cache memory 330.

Figure 9:
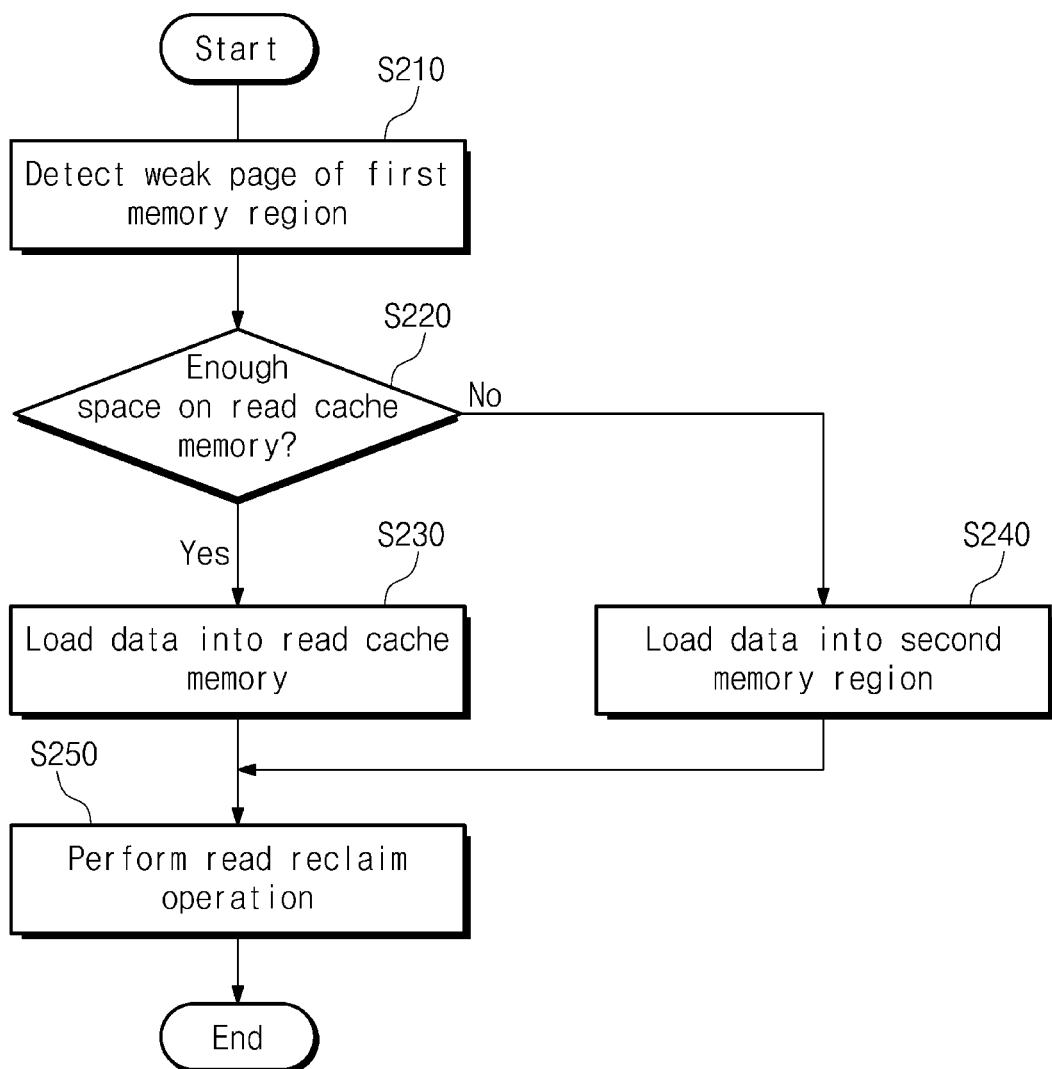
FIG. 9 is a flowchart illustrating a read reclaim method of a storage device of FIG. 8.

FIG. 9 is a flowchart illustrating a read reclaim method of a storage device of FIG. 8. The read reclaim method may be performed by the storage devices 100 and 300 of FIGS. 1 and 8. For convenience of description, FIG. 9 will be described with reference to reference numerals/marks of FIG. 8.

In operation S210, the memory controller 310 detects a weak page in the first memory area 322. Operation S210 corresponds to operation S110 of FIG. 6. Based on the weak page, the memory controller 310 may determine a target area and may perform a read operation on the target area.

In operation S220, the memory controller 310 may determine whether a space of the read cache memory 330 is sufficient to load the target data TAD corresponding to the target area. In the case where the free space of the read cache memory 330 is not smaller than (or exceeds) the size of the target data TAD, it may be determined that the free space is sufficient. In the case where the free space of the read cache memory 330 is sufficient, operation S230 is performed. In the case where the free space of the read cache memory 330 is smaller than (or not greater than) the size of the target data TAD, it may be determined that the free space is insufficient. In the case where the free space of the read cache memory 330 is insufficient, operation S240 is performed.

In the case where enough space is present in the read cache memory 330, in operation S230, the memory controller 310 loads the target data TAD into the read cache memory 330. In the case where the free space of the read cache memory 330 is insufficient, in operation S240, the memory controller 310 loads the target data TAD into the second memory area 323.

In operation S250, the memory controller 310 may perform the read reclaim operation on a memory block including the target area. While the read reclaim operation is performed, the memory controller 310 may receive a read request corresponding to at least one page of the target area from the host. In the case where operation S250 is performed after operation S230, the memory controller 310 may read the read data RD from the read cache memory 330. In the case where operation S250 is performed after operation S240, the memory controller 310 may read the read data RD from the second memory area 323.

Figure 10:
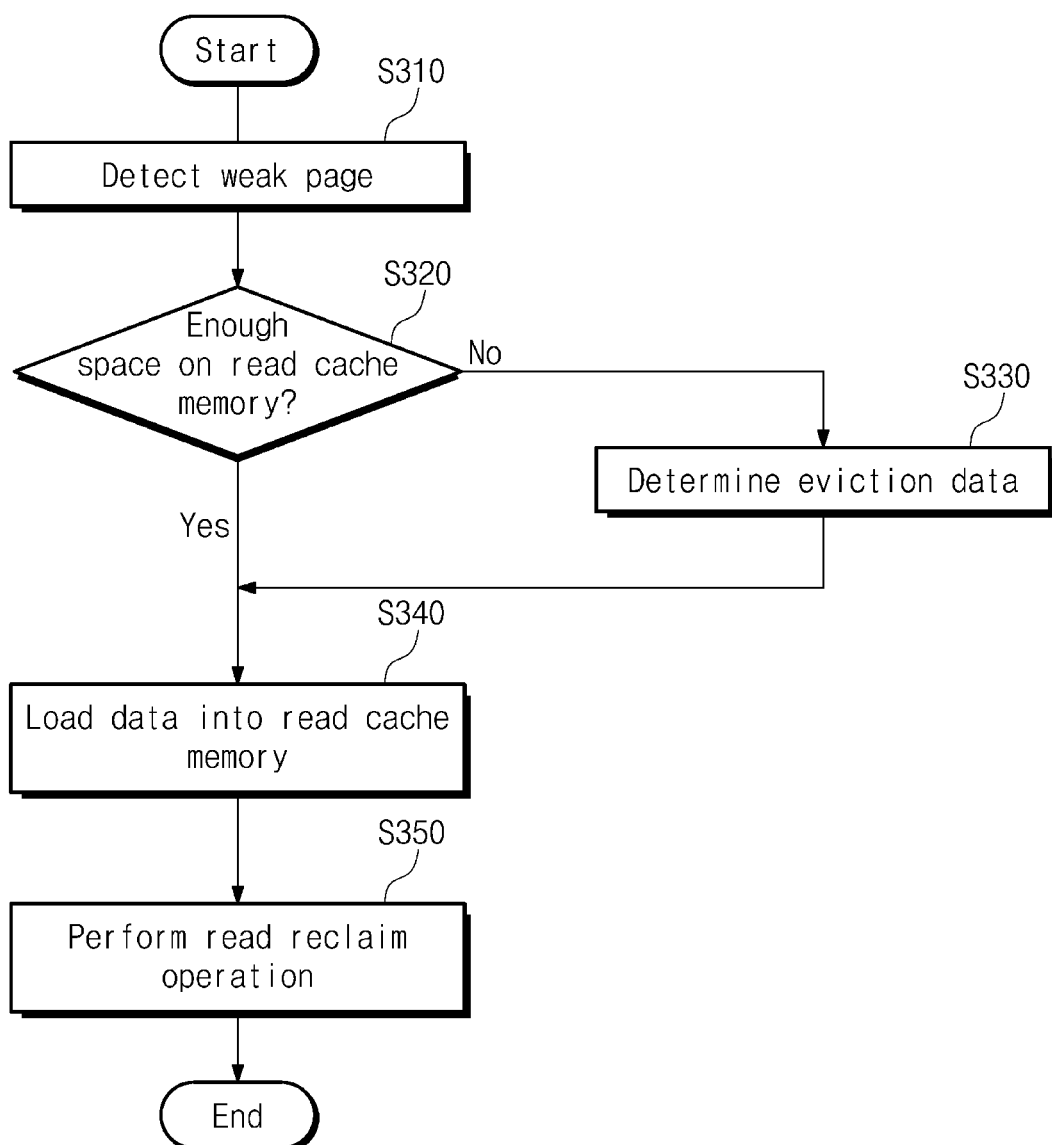
FIG. 10 is a flowchart illustrating a read reclaim method of a storage device of FIG. 5 or 8.

FIG. 10 is a flowchart illustrating a read reclaim method of a storage device of FIG. 5 or 8. The read reclaim method may be performed by the storage devices 100, 200, and 300 of FIGS. 1, 5, and 8. For convenience of description, FIG. 10 will be described with reference to reference numerals/marks of FIG. 8.

In operation S310, the memory controller 310 detects a weak page. Operation S310 corresponds to operation S110 of FIG. 6 or operation S210 of FIG. 8. Based on the weak page, the memory controller 310 may determine a target area and may perform a read operation on the target area.

In operation S320, the memory controller 310 may determine whether a space of the read cache memory 330 is sufficient to load the target data TAD corresponding to the target area. In the case where the free space of the read cache memory 330 is sufficient, operation S340 is performed. In the case where the free space of the read cache memory 330 is insufficient, operation S330 is performed.

Since the free space of the read cache memory 330 is insufficient, in operation S330, the memory controller 310 determines eviction data. The eviction data are deleted from the read cache memory 330. In the case where the nonvolatile memory device 320 includes the second memory area 323, the eviction data may be written to the second memory area 323.

For example, the eviction data may be determined based on the frequency of use of data. For example, data stored in the read cache memory 330 may be evicted in the order of small read count (or hit count). That is, data having a small read count may be evicted because the data are determined as having a low influence on adjacent pages.

For example, the eviction data may be determined based on the order of execution of the read reclaim operation. For example, data stored in the read reclaim operation may be evicted in the order of completion of the read reclaim operation. The read reclaim operation may be performed in the order of registration at the queue, and data corresponding to a memory block may be evicted based on the order in which a memory block is registered at the queue. That is, data, the read reclaim operation of which is performed in high priority, may be evicted because the data are determined as having the low probability of loss.

For example, the eviction data may be determined based on the degree with which data are damaged. For example, data may be evicted in the order of low deterioration. For example, the deterioration may be determined based on an error bit corrected by the error correction code engine 114 of FIG. 2. For example, the degree of deterioration may be determined based on the number of correctable cells or the number of times that an error correction operation is performed. The smaller the number of correctable cells or the number of times, the earlier the time when data are evicted. That is, data of low deterioration may be evicted because the data are determined as having the low probability of loss.

The above examples of the eviction data are described as being determined with respect to data stored in the read cache memory 330, but the disclosure is not limited thereto. For example, it may be understood that the examples may be applied to data stored in the second memory area 323. That is, in the case where a free space of the second memory area 323 is insufficient, data may be evicted based on the frequency of use of data, the order of execution of the read reclaim operation, or the degree with which data are damaged.

In operation S340, the memory controller 310 loads the target data TAD into the read cache memory 330. Since it is determined in operation S320 that the free space of the read cache memory 330 is sufficient or since a portion of data in the read cache memory 330 is evicted in operation S330, the target data TAD may be stored to the read cache memory 330.

In operation S350, the read reclaim operation may be performed on a memory block including the target area. While the read reclaim operation is performed, the memory controller 310 may receive a read request corresponding to at least one page of the target area from the host. The memory controller 310 may read the read data RD from the read cache memory 330.

Figure 11:
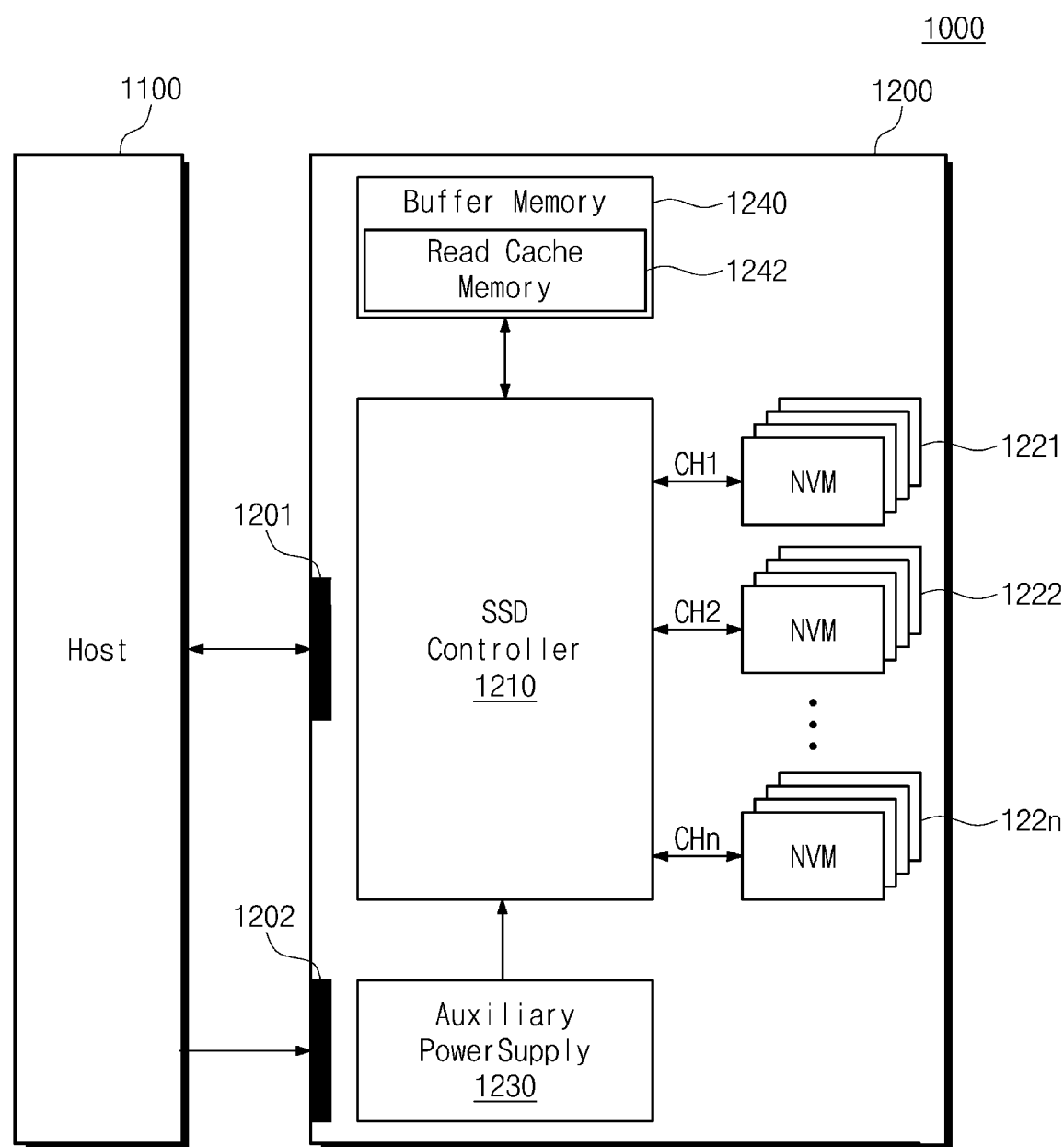
FIGS. 11 to 13 are block diagrams illustrating a storage system according to embodiments of the disclosure.

FIG. 11 is a block diagram illustrating a storage system according to an embodiment of the disclosure. Referring to FIG. 11, a storage system 1000 includes a host 1100 and a solid state drive 1200 (hereinafter referred to as an "SSD"). The storage devices 100, 200, and 300 described with reference to FIGS. 1 to 10 are implemented in the SSD 1200. The SSD 1200 exchanges a signal with the host 1100 through a signal connector 1201 and receives a power through a power connector 1202. The SSD 1200 includes an SSD controller 1210, a plurality of nonvolatile memory devices 1221 to 122*n*, an auxiliary power supply 1230, and a buffer memory 1240.

The SSD controller 1210 may control the nonvolatile memory devices 1221 to 122*n* in response to the signal from the host 1100. The nonvolatile memory devices 1221 to 122*n* are connected with the SSD controller 1210 through a plurality of channels CH1 to CHn. The SSD controller 1210 corresponds to the memory controllers 110, 210, and 310 described with reference to FIGS. 1 to 10, and each of the nonvolatile memory devices 1221 to 122*n* corresponds to the nonvolatile memory devices 120, 220, and 230 described with reference to FIGS. 1 to 10.

That is, the SSD controller 1210 may detect a target area of the plurality of nonvolatile memory devices 1221 to 122*n* and may write target data stored in the target area to the buffer memory 1240. The SSD controller 1210 performs the read reclaim operation on a memory block corresponding to the target area. In the case where a read request corresponding to the target area is received while the read reclaim operation is performed, the SSD controller 1210 may read the target data from the buffer memory 1240.

The auxiliary power supply 1230 may be charged by the power from the host 1100 through the power connector 1202. When the power is not smoothly supplied from the host 1100, the auxiliary power supply 1230 may power the storage system 1000. For example, the auxiliary power supply 1230 may be placed inside or outside the SSD 1200.

The buffer memory 1240 operates as a buffer memory of the SSD 1200. The buffer memory 1240 corresponds to the buffer memory 130 described with reference to FIG. 1. The buffer memory 1240 includes a read cache memory 1242 for storing target data before the read reclaim operation. The read cache memory 1242 may correspond to the read cache memories 132, 230, and 330 described with reference to FIGS. 1 to 10.

Figure 12:
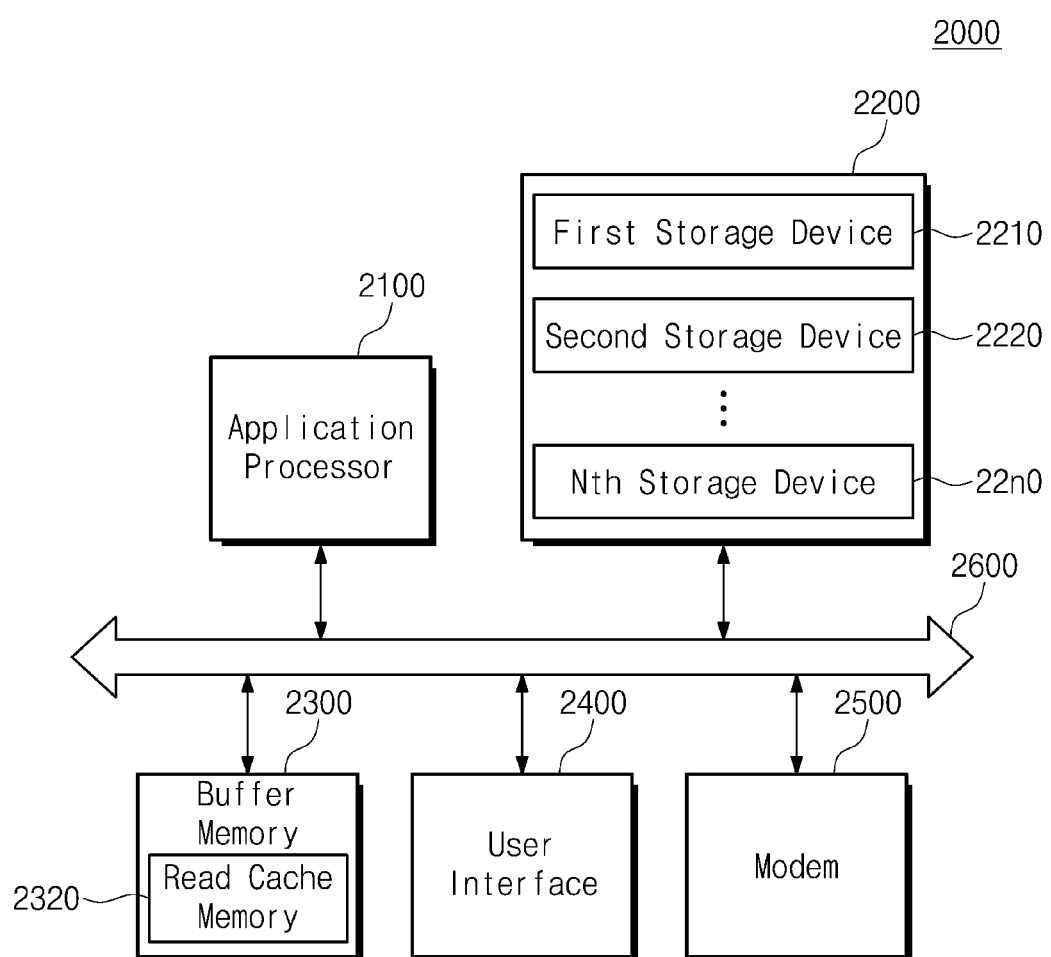

FIG. 12 is a block diagram illustrating a storage system according to an embodiment of the disclosure. Referring to FIG. 12, a storage system 2000 includes an application processor 2100, a storage unit 2200, a buffer memory 2300, a user interface 2400, a modem 2500, and a bus 2600. The storage devices 100, 200, and 300 described with reference to FIGS. 1 to 10 may be implemented with the storage unit 2200 and the buffer memory 2300 of the storage system 2000.

The application processor 2100 may drive components included in the storage system 2000, and an operating system (OS). In an embodiment, the application processor 2100 may include interfaces, graphics engines, controllers to control the components of the storage system 2000, etc. The application processor 2100 may be implemented with a system-on-chip (SoC).

The storage unit 2200 includes a plurality of storage devices 2210 to 22*n*0. Each of the plurality of storage devices 2210 to 22*n*0 may correspond to the storage devices 100, 200, and 300 described with reference to FIGS. 1 to 10. Each of the storage devices 2210 to 22n0 may perform the above-described read reclaim operation. The storage unit 2200 may store data received from the application processor 2100. The storage unit 2200 may transmit data stored in the plurality of storage devices 2210 to 22n0 to the application processor 2100.

The buffer memory 2300 operates as a buffer memory of the storage system 2000. The buffer memory 2300 includes a read cache memory 2320 for storing target data before the read reclaim operation. The read cache memory 2320 may be the read cache memories 132, 230, and 330 described with reference to FIGS. 1 to 10. The read cache memory 2320 may be provided outside the plurality of storage devices 2210 to 22n0.

The user interface 2400 may include interfaces which input data or an instruction to the application processor 2100 or output data to an external device. The user interface 2400 may include a user input interface, which receives information from the user, such as a keyboard, a mouse, a touch panel, or a microphone, and a user output interface, which provides information to the user, such as a monitor, a speaker, or a motor.

The modem 2500 is configured to perform wired or wireless communication with an external device. The modem 2500 may be configured to implement at least one of various standards such as long term evolution (LTE), Ethernet, wireless-fidelity (Wi-Fi), and Bluetooth.

The bus 2600 may provide channels between the components of the storage system 2000. The bus 2600 may be implemented in compliance with one of various standards such as peripheral component interconnect express (PCIe) and advanced microcontroller bus architecture (AMBA).

Figure 13:
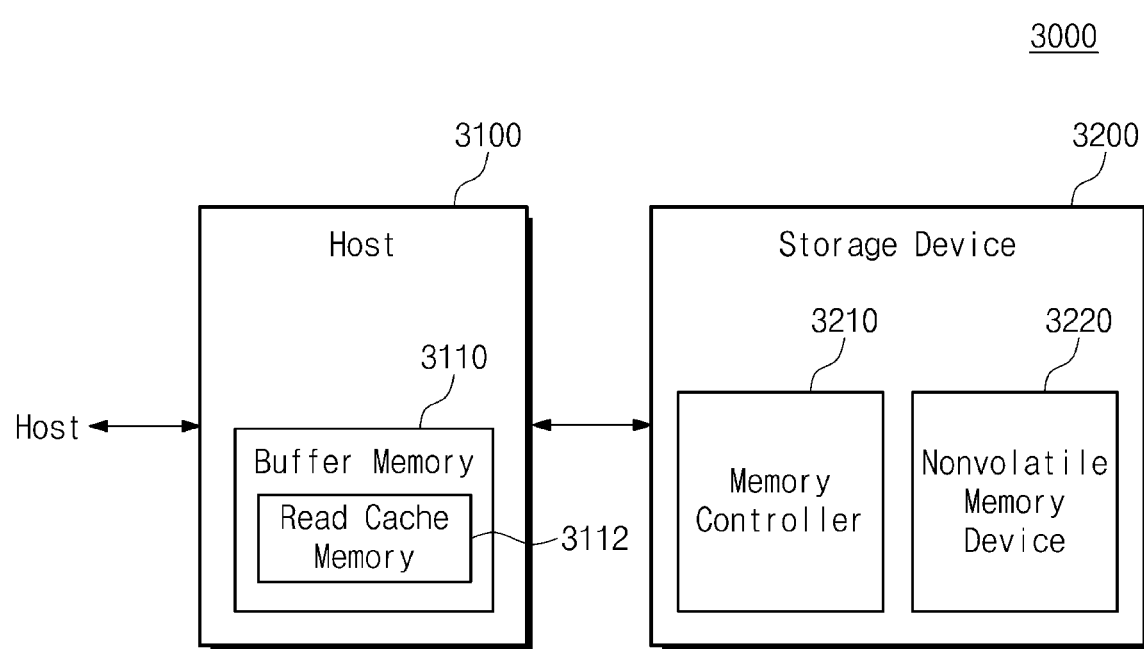

FIG. 13 is a block diagram illustrating a storage system according to an embodiment of the disclosure. Referring to FIG. 13, a storage system 3000 may include a host 3100 and a storage device 3200. The host 3100 includes a buffer memory 3110. The storage devices 100, 200, and 300 described with reference to FIGS. 1 to 10 may be implemented with the storage device 3200 and the buffer memory 3110 of the storage system 3000.

The buffer memory 3110 operates as a buffer memory of the storage system 3000. The buffer memory 3110 includes a read cache memory 3112 for storing target data before the read reclaim operation. The read cache memory 3112 corresponds to the read cache memory 132, 230, and 330 described with reference to FIGS. 1 to 10. The read cache memory 3112 may be included in the host 3100.

The storage device 3200 includes a memory controller 3210 and a nonvolatile memory device 3220. The memory controller 3210 corresponds to the memory controllers 110, 210, and 310 described with reference to FIGS. 1 to 10, and the nonvolatile memory device 3220 corresponds to the nonvolatile memory devices 120, 220, and 230 described with reference to FIGS. 1 to 10. That is, the memory controller 3210 may detect a target area of the nonvolatile memory device 3220 and may write target data stored in the target area to the read cache memory 3112.

According to an embodiment of the disclosure, by performing a read operation by using a buffer memory during a read reclaim operation, data may be prevented from being lost, and a delay of the read operation due to the read reclaim operation may decrease.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. A storage device comprising:
    a nonvolatile memory including a first memory block and a second memory block, wherein the first memory block has weak pages;
    a buffer memory is configured to load first target data stored in the first memory block; and
    a memory controller is configured to:
        copy the first target data stored in the first memory block to the second memory block in response to determining to execute a read-reclaim operation;
        erase the first target data from the first memory block;
        copy the first target data stored in the first memory block to the buffer memory prior to executing the read-reclaim operation;
        prior to erasing the first target data from the first memory block through the read-reclaim operation, read specified data stored in the buffer memory without suspending the read-reclaim operation in response to a first read request from a host device for the specified data among the first target data during the read-reclaim operation; and
        read the specified data stored in the second memory block in response to a second read request for the specified data that is received from the host device after completion of the read-reclaim operation.

2. The storage device of claim 1, wherein the weak pages of the first memory block include a first page having a read count that is not smaller than a reference read count.

3. The storage device of claim 1, wherein the weak pages of the first memory block include a second page adjacent to a first page having a read count that is not smaller than a reference read count.

4. The storage device of claim 1, wherein the weak pages of the first memory block include:
    a page having a number of correctable cells that is not smaller than a first reference value, or
    a page on which an operation for correction of the correctable cells is performed as much as a second reference value or more.

5. The storage device of claim 1, wherein when the first read request for the first memory block is not received, the memory controller determines whether to execute the read-reclaim operation.

6. The storage device of claim 1, wherein when the memory controller performs a read operation on at least one of the weak pages included in the first memory block, the memory controller determines whether to execute the read-reclaim operation.

7. The storage device of claim 1, wherein the buffer memory includes a read cache memory, and
wherein the memory controller determines a third memory block of the nonvolatile memory, which is targeted for another read-reclaim operation, reads second target data from the third memory block, and compares a size of the second target data and a free space of the read cache memory.

8. The storage device of claim 7, wherein when the free space is not smaller than the size of the second target data, the memory controller writes the second target data to the read cache memory.

9. The storage device of claim 7, wherein when the free space is smaller than the size of the second target data, the memory controller writes the second target data to a fourth memory block of the nonvolatile memory.

10. The storage device of claim 9, wherein a number of bits per unit memory cell of the fourth memory block is smaller than a number of bits per unit memory cell of the first to third memory blocks.

11. The storage device of claim 7, wherein when the free space is smaller than the size of the second target data, the memory controller copies the first target data to a fourth memory block of the nonvolatile memory and writes the second target data to the read cache memory.

12. The storage device of claim 7, wherein when the free space is smaller than the size of the second target data, the memory controller determines data to be evicted from the read cache memory, based on read counts corresponding to the data stored in the read cache memory.

13. The storage device of claim 7, wherein when the free space is smaller than the size of the second target data, the memory controller determines data to be evicted from the read cache memory, based on an order of read-reclaim operations corresponding to the data stored in the read cache memory.

14. The storage device of claim 7, wherein when the free space is smaller than the size of the second target data, the memory controller determines data to be evicted from the read cache memory, based on corrected error bits of the data stored in the read cache memory.

15. A storage system comprising:
a storage device including a nonvolatile memory including a first memory block and a second memory block, wherein the first memory block has weak pages, and a memory controller;
a buffer memory is configured to load target data stored in the first memory block; and
a host device configured to provide a first read request and a second read request, and
wherein the memory controller is configured to:
copy the target data stored in the first memory block to the second memory block in response to determining to execute a read-reclaim operation;
erase the target data from the first memory block;
copy the target data stored in the first memory block to the buffer memory prior to executing the read-reclaim operation;
prior to erasing the target data from the first memory block through the read-reclaim operation, read specified data stored in the buffer memory without suspending the read-reclaim operation in response to the first read request for the specified data among the target data during the read-reclaim operation; and
read the specified data stored in the second memory block in response to the second read request for the specified data after completion of the read-reclaim operation.

16. The storage system of claim 15, wherein the buffer memory is located in the host device.

17. The storage system of claim 15, wherein the buffer memory is located external of the storage device.

18. A storage device comprising:
a nonvolatile memory including a first memory block and a second memory block, wherein the first memory block has weak pages; and
a memory controller is configured to:
copy target data stored in the first memory block to the second memory block in response to determining to execute a read-reclaim operation;
erase the target data from the first memory block;
copy the target data stored in the first memory block to another memory location prior to executing the read-reclaim operation;
prior to erasing the target data from the first memory block through the read-reclaim operation, read specified data stored in the other memory location without suspending the read-reclaim operation in response to a first read request from a host device for the specified data among the target data during the read-reclaim operation; and
read the specified data stored in the second memory block in response to a second read request for the specified data that is received from the host device after completion of the read-reclaim operation, and
wherein the other memory location is not included in the first memory block and the second memory block.

19. The storage device of claim 18, further comprising a buffer memory in which the other memory location exists.

20. The storage device of claim 18, wherein the nonvolatile memory further includes a memory area including a plurality of single level cells, and
wherein the other memory location exists in the plurality of single level cells of the memory area.

* * * * *